ary Examiner—Siegfried H. Grimm
United States Patent [19]
Roza

[11] Patent Number: 4,467,291
[45] Date of Patent: Aug. 21, 1984

[54] DELTA MODULATOR HAVING OPTIMIZED LOOP FILTER

[75] Inventor: Engel Roza, Eindhoven, Netherlands

[73] Assignee: U.S. Philips Corporation, New York, N.Y.

[21] Appl. No.: 324,232

[22] Filed: Nov. 23, 1981

[51] Int. Cl.³ .............................................. H03K 13/22
[52] U.S. Cl. ................................. 332/11 D; 375/28; 375/34
[58] Field of Search .................. 332/11 D; 375/27–29, 375/34

[56] References Cited

U.S. PATENT DOCUMENTS 3,706,944 12/1972 Tewksbury ........................ 332/11 D
3,896,399 7/1975 McDonald ........................ 332/11 D Primary Examiner—Siegfried H. Grimm
Attorney, Agent, or Firm—Thomas A. Briody; William J. Streeter

[57] ABSTRACT

A delta modulator comprising a feedback loop incorporating a cascade arrangement formed by a difference producer, a loop filter, a two-level quantizer, a clock pulse-controlled sampler and a feedback path. In order to optimize the signal/quantization noise ratio the minimum phase loop filter has such a phase characteristic that the phase shift in the feedback loop caused by the time delay of the sampler is replenished to approximately 180° with a certain margin, in a frequency range up to a certain cut-off frequency, the phase of the loop filter being constant above the cut-off frequency.

3 Claims, 9 Drawing Figures

DELTA MODULATOR HAVING OPTIMIZED LOOP FILTER

BACKGROUND OF THE INVENTION

The invention relates to a delta modulator comprising a feedback loop incorporating a cascade arrangement formed by a difference producer, a loop filter, a two-level quantizer, a clock pulse-controlled sampler, and a feedback path from the output of the sampler to an input of the difference producer to another input of which the signal to be coded is applied, the sequence of the difference producer and the loop filter being irrelevant.

Such a delta modulator or delta-sigma modulaor is generally known. The loop filter thereof is usually in the form of a single or a double integrator.

It has already been proposed to implement the loop filter in what are commonly referred to as oversampled delta modulators as a higher order filter, to eliminate the quantization noise in the speech band.

The invention has for its object to optimize the loop filter as regards the signal-to-quantization noise ratio at the output of the delta modulator.

SUMMARY OF THE INVENTION

The delta modulator according to the invention is therefore characterized in that the loop filter is a minimum-phase network having such a phase characteristic that the phase shift in the feedback loop caused by the frequency independent time delay of the sampler is replenished to approximately 180° with a certain margin (m), in the frequency range which at the upper side is limited by the lowest frequency of the frequencies $\omega = \pi/\tau$ and $\omega = \pi/T$, wherein $\tau$ represents the frequency-independent time delay of the sampler and T represents the sampling period, the phase of the loop filter being constant above the cutoff frequency.

The invention is based on the recognition that a delta modulator or a delta-sigma modulator can be represented, at least approximately, by a linear feedback network incorporating a time delay ($\tau$) and a noise source (N). The time delay represents the time delay produced by the sampler and the parasitic delays in the electronic components between the input and the output of the sampler. The noise source represents the quantization noise caused by the sampler itself, because of the fact that the output signal of the quantizer is sampled at clock instants.

Optimum filters for linear feedback networks are minimum-phase networks. Based on the recognition which underlies the invention, the optimum loop filter for a delta modulator or a delta-sigma modulator is a minimum-phase network the phase shift of which is still just compatible with maintaining the stability of the feedback loop. The sum of the phase resulting from the time delay ($\tau$) and the phase of the loop filter must therefore not exceed 180°.

BRIEF DESCRIPTION OF THE DRAWINGS

The invention will now be further described by way of example with reference to the Figures in the accompanying drawing wherein.

DETAILED DESCRIPTION OF THE PREFERRED EMBODIMENTS

Figure 1:
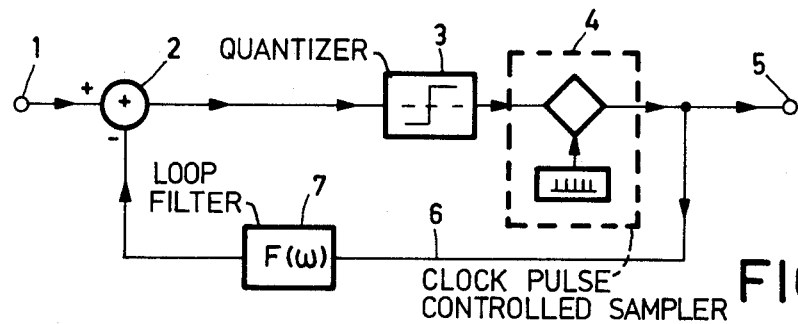
FIG. 1 shows the block diagram of a delta modulator.

The delta modulator shown in FIG. 1 has an input 1 to which the signal to be encoded is applied. This input terminates in a difference producer 2 the output of which is connected to a two-level quantizer 3. The output of this quantizer is connected to a clock pulse-controlled sampler 4 at the output of which the coded input signal appears in a one bit code which is applied to the output 5 and the feedback path 6. This feedback path 6 which incorporates loop filter 7 [transfer function $F(\omega)$] returns a portion of the output signal of sampler 4 in a filtered form to a second input of difference producer 2.

Figure 2:
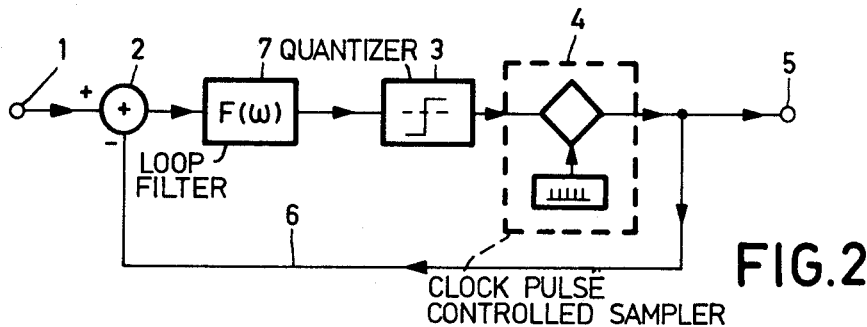
FIG. 2 shows the block diagram of a delta-sigma modulator.

Moving the loop filter 7 to a position between the difference producer 2 and the quantizer 3 results in the delta-sigma modulator as shown in FIG. 2.

In many practical uses, the filter 7 is a single or a double integrator.

Figure 3:
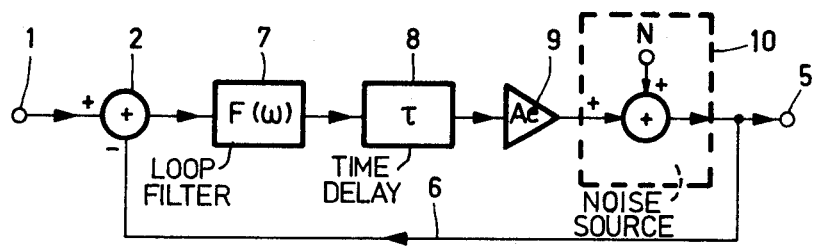
FIG. 3 shows the equivalent circuit diagram, based on the recognition of the invention, of the delta-sigma modulator shown in FIG. 2.

The invention is based on the recognition of the fact that the delta-sigma modulator as shown in FIG. 2 can be represented, at least approximately, by the linear feedback network as shown in FIG. 3, which incorporates the loop filter 7 [transfer function $F(\omega)$], a time delay element 8 (delay $\tau$), an amplifier 9 (gain Ae) and a noise source 10. The time delay produced by element 8 represents the time delay of sampler 4. The noise source 10 represents the quantization noise (N) which the sampler 4 adds to the output signal of the quantizer 3, because of the fact that the output signal is sampled at clock instants.

Figure 4:
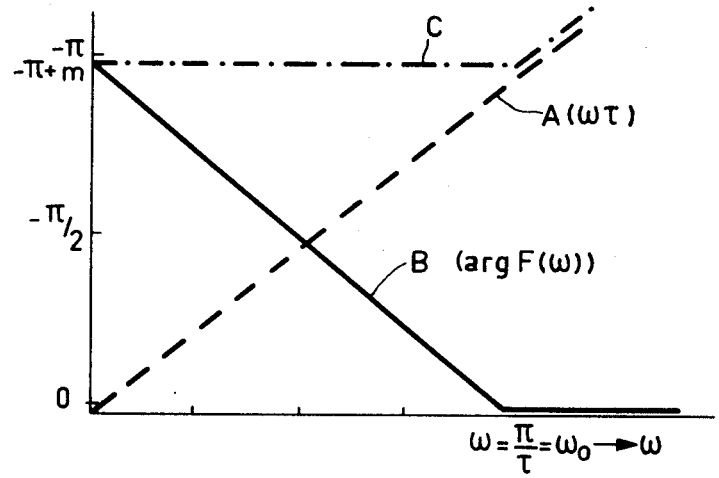
FIG. 4 shows some phase characteristics associated with the feedback network shown in FIG. 3.

For a time delay $\tau = T$, wherein T is the sampling period, the curve A of FIG. 4 shows the variation of the phase versus the (angular frequency $\omega$. At the frequency $\omega = \pi/\tau = \pi/T = \omega_0 = \omega_s/2$, that is to say at half the sampling frequency $\omega_s$ the phase is $-\pi$.

Figure 5:
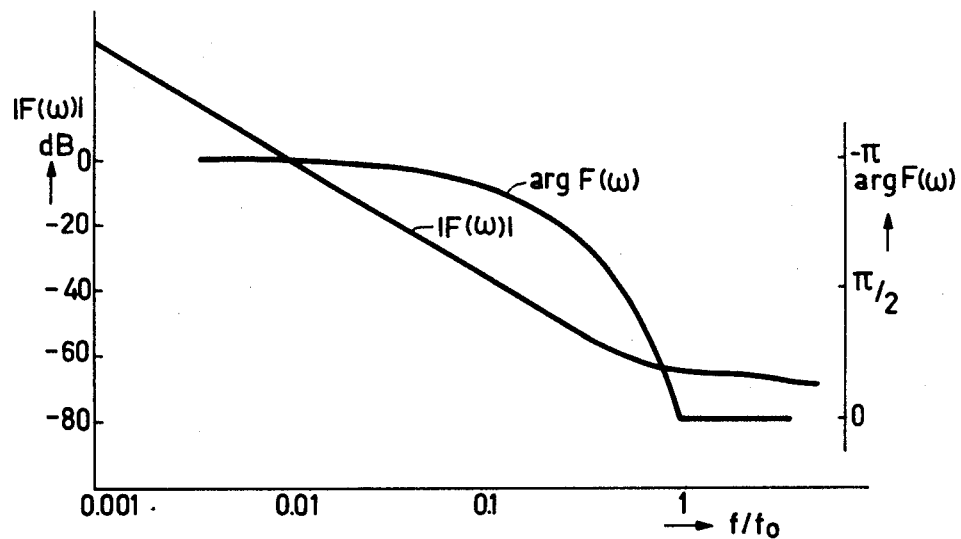
FIG. 5 shows a phase characteristic and an associated amplitude characteristic on a logarithmic scale, of a minimum-phase loop filter.

In accordance with the invention, the loop filter 7 has a phase characteristic in accordance with curve B which shows the variation of arg$F(\omega)$. The phase characteristic of filter 7 and element 8 together is represented by curve C. In the frequency range from zero to $\omega = \omega_0$, the total phase is approximately $-\pi$ with a certain margin (m). For m such a value will be chosen that the stability of the feedback loop in practical circumstances is ensured. The amplitude characteristic $|F(\omega)|$ and the phase characteristic arg$F(\omega)$ of the optimum minimum-phase loop filter for $\tau = T$, on a logarithmic frequency scale, are shown in FIG. 5.

For the feedback loop of FIG. 3 it holds that the frequency $\omega=\omega_o$, at which the phase shift of the feedback loop passes through 180° (curve C, FIG. 4), the loop gain is precisely one. For the gain $A_e$ it then holds:

$$A_e=1/|F(\omega_o)|$$

If the phase of the loop filter is zero at $\omega=\omega_o$ (curve B, FIG. 4), then it holds that:

$$A_e=1/R_eF(\omega_o)$$

wherein ReF ($\omega_o$) represents the real portion of F($\omega$) at the frequency $\omega=\omega_o$.

Several reasons can be given why a phase variation in accordance with curve B is optimal.

1. When arg F ($\omega$) is greater than zero for $\omega>\omega_o$, then the loop filter obtains a differentiating character, causing the differences between |F($\omega$)| at the baseband frequencies and |F($\omega$)| at the frequency $\omega_o$ to decrease.

2. When the margin m for $\omega<\omega_o$ is taken greater than necessary with a view to the stability, then the difference between |F($\omega$)| at low frequencies and |F($\omega$)| at high frequencies decreases.

A decrease of the difference stated sub (1) and (2) will result in a lower signal-to-noise ratio in the baseband and consequently furnishes a result which is not so optimal.

Figure 6:
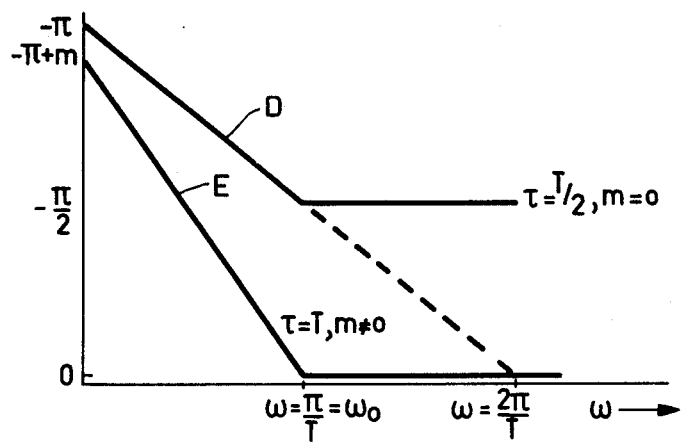
FIG. 6 shows the phase characteristics of the optimum loop filters for different values of the time delay ($\tau$).

In FIG. 6 the phase characteristic D illustrates the variation of arg F ($\omega$) of an optimum loop filter for $\tau=T/2$ and m=0. This may be compared with the curve E for $\tau=T$ and m$\neq$0 (corresponds to curve B, FIG. 4).

The curve D results from the consideration that the sampling frequency $\omega_s=2\pi/T$ must be at least twice the frequency $\omega=\omega_o$ at which the phase shift of the loop filter and the phase shift due to time delay $\tau$ together become greater than 180°. The upper limit of the frequency range in which the phase shift of the feedback loop is replenished by the loop filter to 180° is then located at $\omega=\pi/\tau$ or $\omega=\pi/T$, depending on which has the lowest value. For $\tau\geq T$ the phase of the loop filter then varies in accordance with curve B, (FIG. 4) and for $\tau<T$ in accordance with a curve, for example curve D (FIG. 6) for $\tau=T/2$, for which a bend accurs at the frequency $\omega=\pi/T$ at a value of the phase different from zero.

Because of the use of a minimum-phase loop filter which varies in accordance with curve D, |F($\omega$)| in the region of $\omega=\pi/T$ will differ more from |F($\omega$)| for low frequencies then when arg F ($\omega$) varies above $\omega=\pi/T$, as illustrated by the broken line. The feedback loop will then attenuate signals with the frequencies in the vicinity of $\omega=\pi/T$ to a greater extent, whereby the requirement that the sampling frequency $\omega_s=2\pi/T$ be at least equal to twice the highest prevailing signal frequency is satisfied to a better extent.

Applicants have found that the signal-to-quantization noise ratio (S/N) of the modulator in a frequency band from zero to $\omega_B$ may be expressed by:

$$S/N=(3\pi^2/8\omega_oT^2)\{\int(o,\omega_B)|1+H(\omega)|^{-2}d\omega\}^{-1}$$

wherein H ($\omega$)=F($\omega$) exp (-j$\tau$)/|F ($\omega_o$)| and $\omega_o$ is the lowest value of the frequency values $\omega=\pi/\tau$ and $\omega=\pi/T$ and T is the sampling period.

Figure 7:
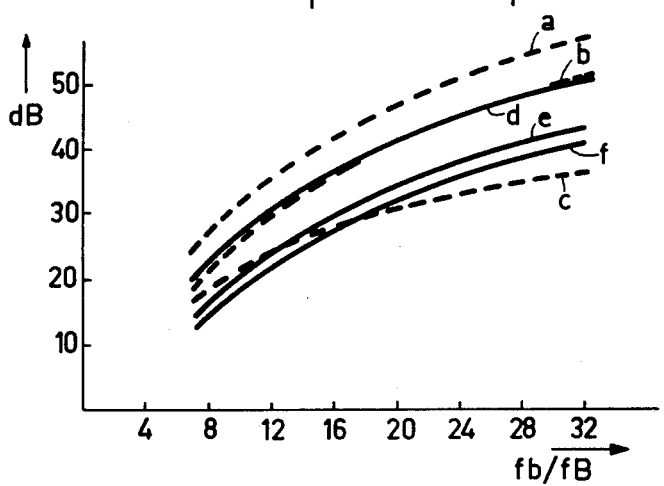
FIG. 7 shows the signal-to-noise ratio-bit rate characteristics for different time delays ($\tau$) and different phase margins (m)

FIG. 7 shows some calculated S/N-characteristics as a function of the ratio of the bit rate fb to the upper limit of the considered frequency band fB=$\omega_B/2\pi$.

| Curve | Parameters |
|---|---|
| a | $\tau = T/2$, m = 0 |
| b | $\tau = T/2$, m = 0.1 $\pi$ |
| c | $\tau = T/2$, loop filter is an ideal integrator |
| d | $\tau = T$, m = 0 |
| e | $\tau = T$, m = 0.1 $\pi$ |
| f | $\tau = 1.25$ T, m = 0.1 $\pi$ |

For a bit rate of 140 Mb/s and a video bandwidth of 5 MHz (fb/fB=28), curve f indicates an S/N ratio of 38 dB, which holds for sinusoidal signals without the use of noise weighting. This is equivalent to 58 dB on the basis of video signals and noise weighting.

Figure 8:
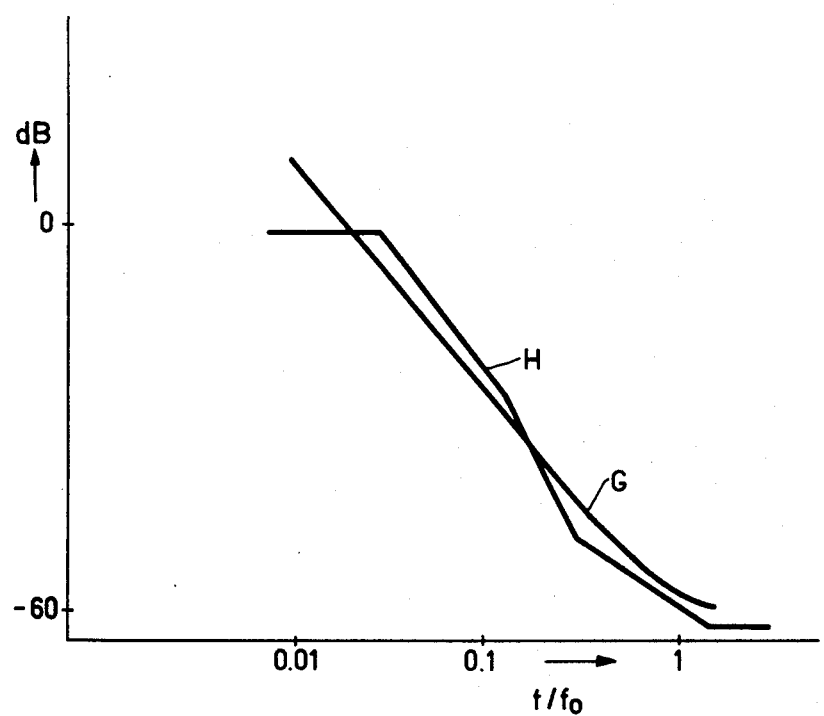
FIG. 8 shows the ideal amplitude characteristic of the loop filter for a particular case and a practical approximation thereof.

The ideal amplitude characteristic of the loop filter on a logarithmic frequency scale for this case (curve f, FIG. 7) is represented by curve G in FIG. 8. The bode diagram of a practical approximation of the ideal characteristic is represented by curve H.

Figure 9:
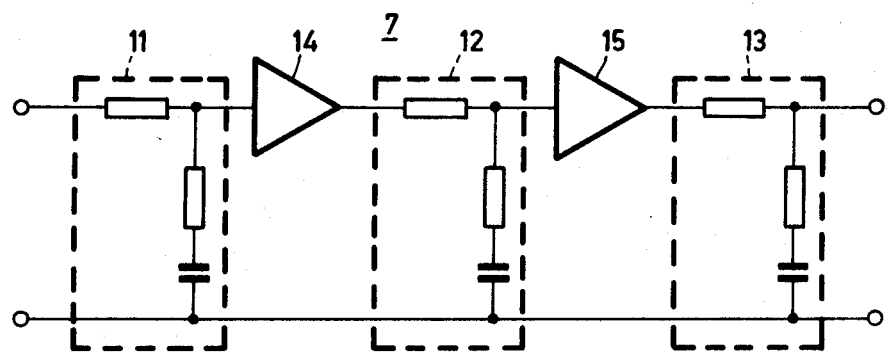
FIG. 9 shows an embodiment of the loop filter.

FIG. 9 shows an embodiment of the loop filter 7 for realizing the phase characteristic H. This filter is formed by the cascade arrangement of three RC-sections 11, 12 and 13 and two isolation amplifiers 14 and 15. The transfer function has the following poles and zero points:

| Poles | Zero points |
|---|---|
| 1.0 MHz (2x) | 15 MHz (2x) |
| 6.25 MHz | 70 MHz. |

What is claimed is:

1. In a delta modulator comprising a feedback loop incorporating a cascade arrangement formed by a difference producer, a loop filter, a two-level quantizer, a clock pulse controlled sampler and a feedback path from the output of the sampler to an input of the difference producer to another input of which the signal to be coded is applied, the improvement wherein the loop filter is a minimum-phase network having such a phase characteristic that phase shift in the feedback loop caused by the frequency-independent time delay of the sampler is restored to approximately 180° with a certain margin (m), in the frequency range having an upper side which is limited by the lowest frequency of the frequencies $\omega=\pi/\tau$ and $\omega=\pi/T$, wherein $\tau$ represents the frequency-independent time delay of the sampler and T represents the sampling period, the phase of the loop filter being constant above the upper side of the frequency range.

2. The invention according to claim 1 wherein the loop filter is connected in the feedback loop between the difference producer and the sampler.

3. The invention according to claim 1 wherein the loop filter is connected in the feedback path of the feedback loop between the output of the sampler and an input of the difference producer.

* * * * *